United States Patent
Cunningham et al.

[11] Patent Number: 6,005,262
[45] Date of Patent: Dec. 21, 1999

[54] FLIP-CHIP BONDED VCSEL CMOS CIRCUIT WITH SILICON MONITOR DETECTOR

[75] Inventors: John Cunningham, Lincroft; Keith Goossen, Aberdeen; Ashok Krishnamoorthy, Middletown, all of N.J.

[73] Assignee: Lucent Technologies Inc., Murray Hill, N.J.

[21] Appl. No.: 09/014,196

[22] Filed: Jan. 27, 1998

Related U.S. Application Data

[60] Provisional application No. 60/056,497, Aug. 20, 1997.

[51] Int. Cl.[6] .......................... H01L 27/15; H01L 31/12; H01L 31/153
[52] U.S. Cl. .............................. 257/84; 257/80; 257/435; 257/98; 257/778
[58] Field of Search ................................. 257/84, 80, 98, 257/435, 778, 659

[56] References Cited

U.S. PATENT DOCUMENTS

| | | |
|---|---|---|
| 4,879,470 | 11/1989 | Sugawa et al. |
| 4,894,699 | 1/1990 | Hayashi et al. |
| 5,031,017 | 7/1991 | Pernyeszi et al. |
| 5,266,794 | 11/1993 | Olbright et al. |
| 5,798,826 | 8/1998 | Yamamoto et al. |
| 5,811,866 | 9/1998 | Hirata . |

*Primary Examiner*—Sheila V. Clark

[57] ABSTRACT

A flip-chip bonded VCSEL CMOS circuit for preventing rearwardly emitted photons from the VCSEL from interfering with CMOS operation. The CMOS has bonding pads affixed thereto and spaced apart to define a region. The VCSEL is mounted to the bonding pads so that a lower mirror of the VCSEL is positioned between the bonding pads and in close proximity to an upper, major surface of the CMOS. A blocking layer is provided and is positioned within the region defined by the bonding pads to absorb or reflect rearwardly emitted photons from the VCSEL. In another embodiment, the blocking layer is removed and a photon detector is formed in the CMOS for collecting the rearwardly emitted photons for use in determining, inter alia, VCSEL laser power.

20 Claims, 2 Drawing Sheets ns262

FLIP-CHIP BONDED VCSEL CMOS CIRCUIT WITH SILICON MONITOR DETECTOR

This application claims priority from Provisional Application No. 60/056,497 filed on Aug. 20, 1997.

BACKGROUND OF THE INVENTION

I. Field of the Invention

This invention pertains to a flip-chip Vertical Cavity Surface Emitting Laser (VCSEL) bonded to a CMOS circuit. More particularly, this invention relates to an improved flip-chip bonded VCSEL CMOS circuit having a mechanism for preventing rearwardly emitted light of the VCSEL from entering the CMOS. The present invention also pertains to a flip-chip bonded VCSEL CMOS circuit having an integrated silicon monitor detector.

II. Description of the Related Art

Optical interconnections based on VCSELs can be used to advantageously provide high bandwidth optical interconnections over fiber optical cable for data communications applications. By virtue of their ability to be produced in arrays and tested in parallel, and the relative ease in coupling the laser emissions to multi-mode fiber, VCSELs have been recognized as an efficient, low cost alternative to edge-emitting semi-conductor lasers and can accommodate data rates of 1 Gbit/s. However, VCSEL sources are typically driven electrically from separate (off-chip) drivers which significantly increase the power dissipation of the driver-VCSEL package and adversely affect the bandwidth of the link.

The efficiency and performance of VCSEL sources can be increased by flip-chip bonding VCSEL devices directly to CMOS. Based on known hybrid flip-chip bonding techniques, it is possible to create three-dimensional optoelectronic-VLSI structures, with the flip-chip bonded optical devices placed directly above the silicon CMOS circuitry.

FIG. 1 depicts a known flip-chip bonded VCSEL CMOS circuit 10. The circuit contains a VCSEL 12 which operatively emits laser light hv, as shown, and a CMOS device 14 that powers the VCSEL. CMOS 14 contains a p-doped semiconductor substrate 16 in which a PMOS transistor 18 and an NMOS transistor 26 are formed. Each transistor has a source region (PMOS-20, NMOS-28), a drain region (PMOS-22, NMOS-30) and a gate (PMOS-24, NMOS-32).

As is known by those having ordinary skill in the art, a first metal layer 35 forms source terminals 36 and drain terminals 37 for the PMOS and CMOS devices. Gate terminals 24 and 33 are formed on a gate oxide layer 32, and insulation layers 34, 38 insulate the gate, source and drain terminals from each other. Additional metallization layers 40, 44 provide electrical communication with the source terminals 36 and drain terminals 37, respectively. These layers are insulated by insulating layers 42, 48, to form an upper major surface 50 of the CMOS device 14. Bonding pads 46 are formed on major surface 50 and are in communication with metal layers 40, 44 and, hence, with source and drain terminals 36, 37. The bonding pads are spaced apart from each other and define a region. The bonding pads are coupled to VCSEL bonding pads (not shown) via soldering, for example, and provide electrical communication between the VCSEL and CMOS. VCSEL 12 has a p-terminal 57 and an n-terminal 58 which are mounted to the bonding pads 46, as for example soldering 52, so that the p-terminal 57 is connected to the CMOS source terminals 36 and the n-terminal 58 is connected to the CMOS drain terminals 37.

An epoxy layer 59 is also provided for further securing VCSEL 12 to CMOS 14. VCSEL 12 has an upper mirror or aperture 54 through which the laser light hv is emitted, and a lower mirror or aperture 56 positioned proximate the CMOS major surface 50 for generating the laser light.

A major design consideration in producing large arrays of VCSEL devices is the mirror technology used to manufacture the mirror surfaces 54 and 56 on the VCSEL. While there are several emerging mirror technologies based on EPI-layer growth or deposition, reliable production of a 100% reflecting surface (to act as one of the reflectors in the micro-cavity) is difficult. Due to the lack of complete surface reflectivity in VCSELs, light may emit from both facets of the VCSEL cavity, e.g. forwardly emitted light hv through upper mirror 54 and rearwardly emitted light 51 through lower mirror 56. The pressure of rearwardly emitted light becomes particularly relevant when a dense three-dimensional structure is sought, which places the laser above or near a CMOS circuit as in the flip-chip bonded VCSEL of FIG. 1. This is because the gate terminals that control the flow of CMOS current are more likely to absorb stray photons that are emitted through lower mirror 56, thus causing degradation of CMOS operation. As the flip-chip bonded VCSEL is driven by the CMOS, degradation of CMOS operation will also degrade VCSEL performance.

SUMMARY OF THE INVENTION

A flip-chip bonded VCSEL CMOS circuit is disclosed for safeguarding a CMOS device, which is used for driving a VCSEL, from rearwardly emitted light that is generated by the VCSEL. The inventive circuit accomplishes this by preventing the rearwardly emitted light from entering the CMOS and interfering with CMOS operation. In particular, and in accordance with one embodiment of the present invention, the circuit includes a CMOS device having a major surface upon which at least two bonding pads are formed. The bonding pads are spaced apart from each other to define a region. A VCSEL having an upper mirror for transmitting forwardly emitted light, and a lower mirror for passing rearwardly emitted light, is mounted on the bonding pads and arranged so that the lower mirror is proximate, e.g. facing, the bonding pads and at least partially aligned with the region so that some of the rearwardly emitted light passes through the region. A blocking layer is formed in the region and receives and blocks the rearwardly emitted light from entering the upper major surface of the CMOS, thereby preventing the photons from the rearwardly emitted light from interfering with CMOS operation.

In another embodiment of the invention, a detector device is formed in the CMOS below the region defined by the bonding pads. The detector is positioned to receive rearwardly emitted light from the VCSEL. The light received by the detector can be used for monitoring CMOS operation.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
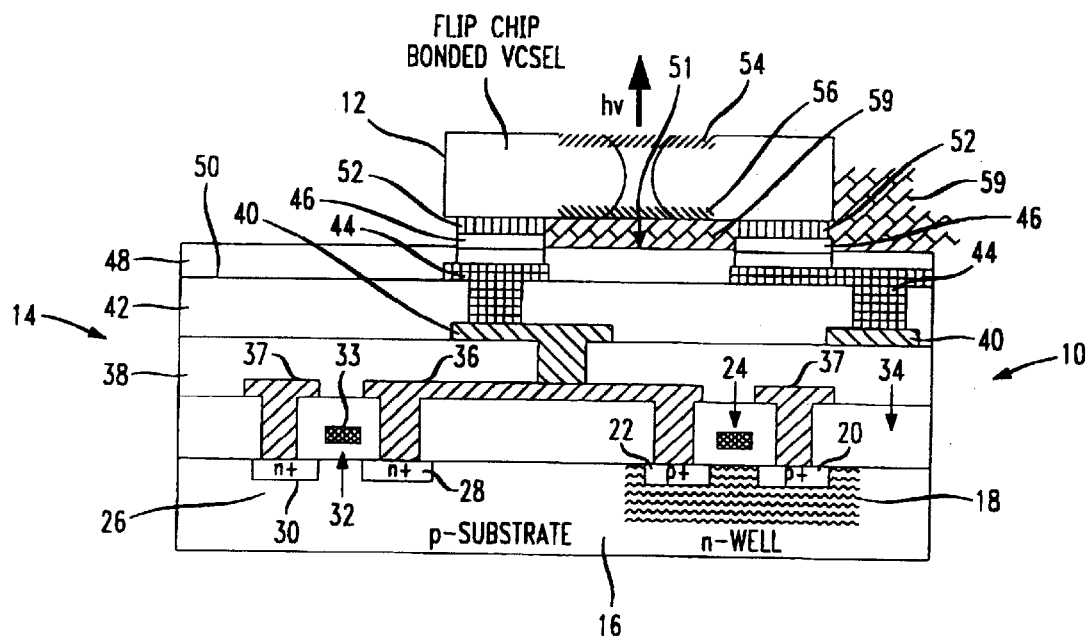
FIG. 1 is a schematic representation of a prior art flip-chip bonded VCSEL CMOS circuit.
Figure 2:
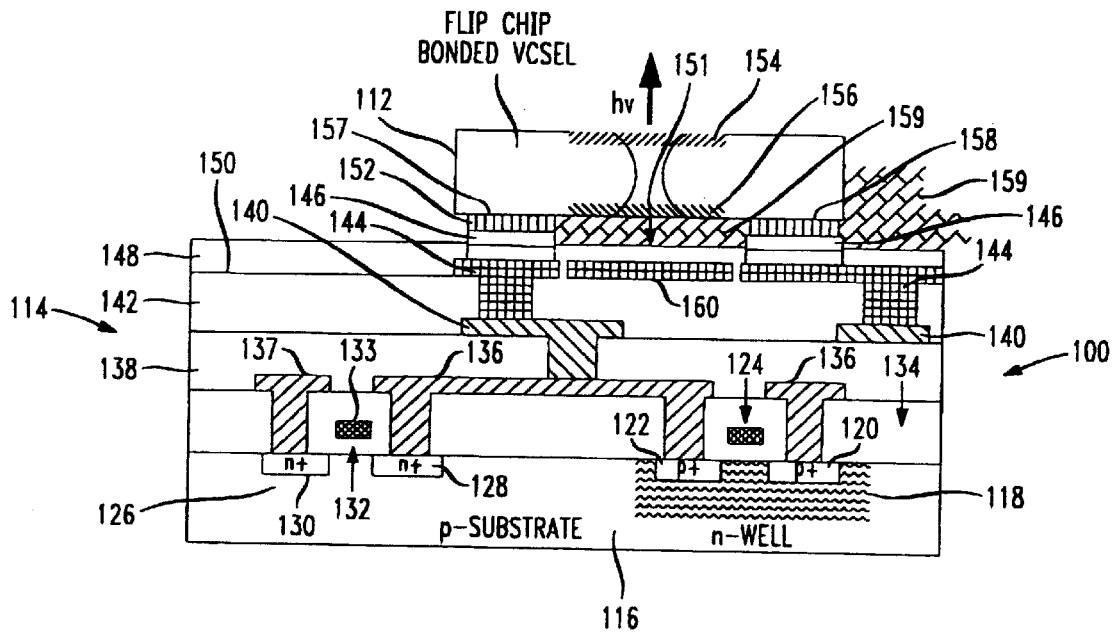
FIG. 2 depicts a flip-chip bonded VCSEL CMOS circuit containing a blocking layer in accordance with the present invention.

With reference now to FIG. 2, a flip-chip bonded VCSEL CMOS circuit 100 constructed in accordance with the invention is there shown. The corresponding reference numerals in FIG. 2 indicate elements similar to those so-labelled in FIG. 1 unless otherwise specified below. In the illustrated embodiment, circuit 100 contains a blocking layer 160 formed between CMOS 114 and VCSEL 112 and between VCSEL bonding pads 146. Blocking layer 160 may be formed of a light absorptive material, such as a dull metal, e.g. aluminum, or a light reflective material, such as quarter-wave pairs of high and low index material, e.g. silicon monoxide, calcium flouride and zinc sulfide.

The blocking layer 160 is positioned below lower mirror 156 and preferably occupies at least the surface area of (i.e. coextensive with) the lower mirror. By so-positioning blocking layer 160 below bottom mirror 156, a substantial amount of the rearwardly emitted light from mirror 156 will be prevented from impinging upon and adversely affecting the operation of CMOS 114. This is done either by absorbing the rearwardly emitted light 151 on blocking layer 160, e.g. by use of a dull metal material, or by reflecting the rearwardly emitted light off of a reflecting material blocking layer 160 in a direction away from CMOS 114. The inclusion of blocking layer 160 provides for three-dimensional integration of VCSELs with transistors by protecting the silicon CMOS chip from rearward emission of light from the VCSEL. As will be appreciated, the blocking of rearwardly emitted light from entering the CMOS 114 prevents the emitted photons from reaching the gate terminals 124, 133 which, in the absence of the blocking layer, will cause cross-talk or interference among transistors in the substrate 116 and affect VCSEL operation.

It is noted that for some CMOS technologies, the rearwardly emitted light that is reflected off of blocking layer 160 (if a reflective material is used) may impede VCSEL operation due to the potential for the reflected light to interfere with VCSEL generated laser light hv. However, inasmuch as the surface topology of practical CMOS devices is not flat, any reflected rearwardly emitted light would not be directed back to the VCSEL 112 through lower mirror 156.

In an alternative embodiment, wherein rearwardly emitted light from VCSEL 112 is blocked from penetrating into CMOS 114, the rearwardly emitted light can be collected and used to monitor the optical power of laser light generated by the VCSEL. In addition, the rearwardly emitted light can be collected and used in a feedback configuration, as is known in the art, to control the VCSEL driver circuit (e.g. CMOS device) to stabilize the VCSEL emitted laser light hv.

Such a device is depicted by way of example in FIG. 3 and is illustrated by reference numeral 200. It includes a detector 270 formed below the flip-chip bonding pads 246 and in place of the PMOS device 118 in FIG. 2. The detector is so-positioned to receive the rearwardly emitted light 258 from lower mirror 256. Detector 270 is basically a p-n junction diode having an n-well 274 formed in a p substrate 216. A p+ doping region 276 is formed in the n-well 274 and detector terminals 280 provide for biasing of the detector 270. Although not shown in FIG. 3, contact 44a is in electrical communication with drain terminals 237 of NMOS 226. Contact 44b is not in electrical communication with detector terminals 280 but is in electrical communication with other PMOS devices (not shown) formed in substrate 216.

The detector 270 can be readily formed in silicon because most VCSELs used in data communications applications operate in the range between about 780 nm to 870 nm, i.e. in the detection range of silicon. Detector 270 can be fully integrated with CMOS circuit 214 and aligned with the flip-chip bonding pads 246 during the CMOS design process. Because the reflectivity of the VCSEL mirrors 54, 56 is known, and the responsivity of silicon at the operating wavelength is also known, the detector current can be equated with the VCSEL emitted power, as is known is the art. This relationship can then be applied in a feedback loop to an appropriate CMOS VCSEL driver circuit and used, for example, to control the driver current for VCSEL operation. In a preferred embodiment, an anti-reflection coating 272, preferably constructed of dull material such as aluminum, is formed above the detector 270. The coating 272 prevents undesirable feedback of rearwardly emitted light into the VCSEL 212.

Figure 3:
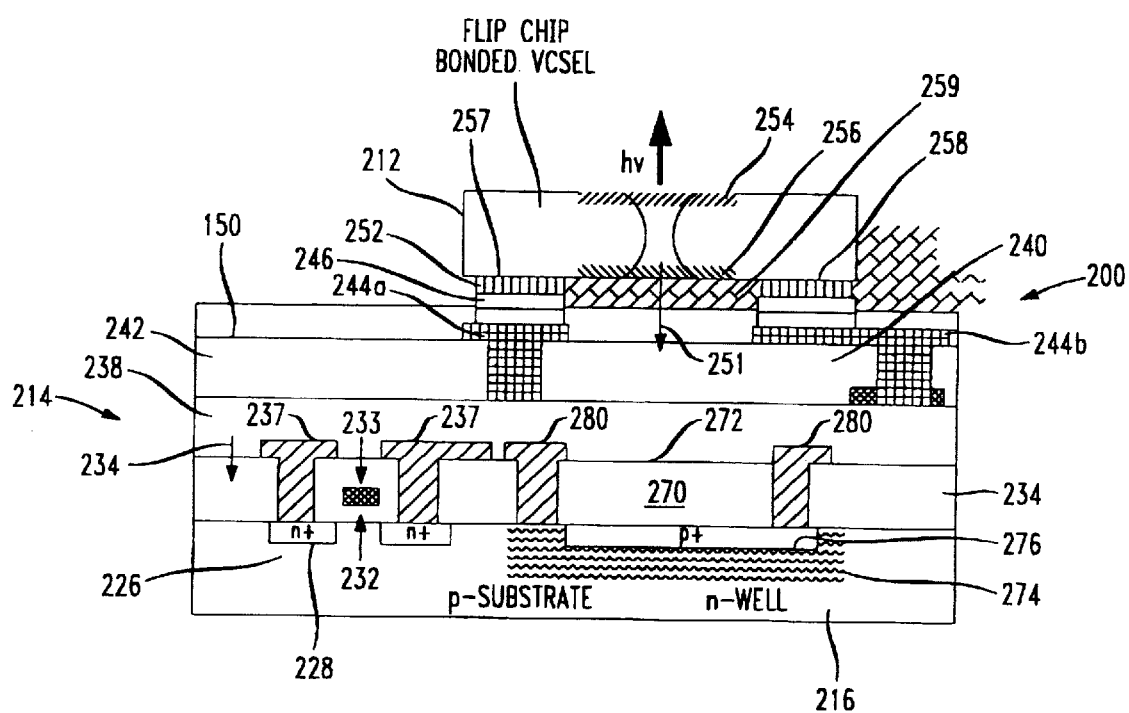
FIG. 3 shows a flip-chip bonded VCSEL CMOS circuit containing a detector in accordance with another embodiment of the present invention.

It will be readily understood that a non-planar VCSEL device, wherein both p and n contacts are located on opposite sides of the VCSEL can be used instead of the planar device depicted in FIGS. 1–3. In such an embodiment, the VCSEL substrate (e.g. GaAs) may serve as a common terminal (e.g. the n terminal contact). For such a structure, only a single bonding pad 146 is required to provide electrical communication between the CMOS and the VCSEL p terminal contact.

The above-described three-dimensional structure of flip-chip bonded VCSELs with CMOS circuits and an integrated detector can be extended from a single optical device to one-dimensional and two-dimensional arrays of such devices, as will be apparent to those having ordinary skill in the art.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, the polarities of the CMOS regions and detector regions, e.g. the substrate and doping regions, can be changed as is known by those having ordinary skill in the art without departing from the scope of the invention. It is expressly intended that all combinations of those elements which perform substantially the same function in substantially the same way to achieve the same results are within the scope of the invention. Therefore, it is intended to be limited only as indicated by the scope of the claims appended hereto.

We claim:

1. A flip-chip bonded VCSEL CMOS circuit for safeguarding a CMOS device from rearwardly emitted light, generated by a VCSEL associated with the circuit, said circuit comprising:

a substrate;

a CMOS device formed on said substrate and having a major surface, said CMOS device including a plurality of transistors having gate terminals, and a bonding pad formed on said major surface;

an associated VCSEL having an upper mirror remote from the bonding pad for transmitting forwardly emitted light, and a lower mirror proximate said bonding pad for passing rearwardly emitted light, said VCSEL being mounted to said bonding pad and in electrical communication with said CMOS; and means on one of said major surface and said substrate for preventing a substantial portion of rearwardly emitted light generated by said VCSEL from impinging on the gate terminals and interfering with current flow of said transistors.

2. The circuit of claim 1, wherein said preventing means comprises a blocking layer formed on said major surface.

3. The circuit of claim 2, wherein said blocking layer absorbs a substantial portion of the rearwardly emitted light from said VCSEL.

4. The circuit of claim 2, wherein said blocking layer is comprised of aluminum.

5. The circuit of claim 2, wherein said blocking layer reflects rearwardly emitted light from said VCSEL.

6. The circuit of claim 5, wherein said blocking layer comprises one of silicon monoxide, calcium fluoride and zinc sulfide.

7. The circuit of claim 1, wherein said substrate is comprised of silicon.

8. The circuit of claim 1, wherein said VCSEL has a bonding pad which is mounted to said CMOS bonding pad.

9. The circuit of claim 8, wherein said CMOS bonding pad comprises a pair of bonding pads and wherein said VCSEL bonding pad comprises a pair of bonding pads.

10. The circuit of claim 1, wherein said preventing means comprises a detector formed on said substrate for detecting a substantial portion of rearwardly emitted light from said VCSEL.

11. The circuit of claim 10, further comprising an anti-reflective coating positioned above said detector for preventing rearwardly emitted light from re-entering said VCSEL through said lower mirror.

12. The circuit of claim 11, wherein said anti-reflection coating comprises aluminum.

13. The circuit of claim 10, wherein said substrate is comprised of silicon.

14. The circuit of claim 10, wherein said detector generates a signal indicative of a laser power of said VCSEL.

15. A flip-chip bonded VCSEL CMOS circuit for safeguarding a CMOS device from rearwardly emitted light, generated by a VCSEL associated with the circuit, said circuit comprising:

a substrate;

a CMOS device formed on said substrate and having a major surface, said CMOS device including a plurality of transistors having gate terminals, and a bonding pad formed on said major surface;

an associated VCSEL having an upper mirror remote from the bonding pad for transmitting forwardly emitted light, and a lower mirror proximate said bonding pad for passing rearwardly emitted light, said VCSEL being mounted to said bonding pad and in electrical communication with said CMOS; and a detector formed on said substrate for detecting a substantial portion of rearwardly emitted light from said VCSEL.

16. The circuit of claim 15, wherein said bonding pad comprises a pair of bonding pads spaced apart from each other to form a region, and wherein said detector is partially aligned with said region.

17. The circuit of claim 15, further comprising an anti-reflective coating positioned above said detector for preventing rearwardly emitted light from re-entering said VCSEL through said lower mirror.

18. The circuit of claim 17, wherein said anti-reflection coating comprises aluminum.

19. The circuit of claim 15, wherein said substrate is comprised of silicon.

20. The circuit of claim 15, wherein said detector generates a signal indicative of a laser power of said VCSEL.

* * * * *